United States Patent [19]

Sara

[11] 4,178,097
[45] Dec. 11, 1979

[54] AUTOMATIC LITHOGRAPHIC PLATE PROCESSOR

[75] Inventor: George M. Sara, Garden Grove, Calif.

[73] Assignee: Beach Manufacturing Corporation, Huntington Beach, Calif.

[21] Appl. No.: 830,820

[22] Filed: Sep. 6, 1977

[51] Int. Cl.² ............................................. G03B 27/30
[52] U.S. Cl. ....................................... 355/100; 118/37; 118/58; 271/11; 354/318; 355/132; 414/112
[58] Field of Search ........................ 355/85, 100, 132; 118/37, 58; 156/345; 214/8.5 D; 271/11; 96/200; 354/318

[56] References Cited

U.S. PATENT DOCUMENTS

| | | | |
|---|---|---|---|
| 3,448,720 | 6/1969 | Graham | 118/109 |
| 3,520,606 | 7/1970 | Gush et al. | 355/85 |
| 3,597,080 | 8/1971 | Gush et al. | 355/85 |
| 3,608,464 | 9/1971 | Harrell et al. | 355/100 X |
| 3,635,559 | 1/1972 | Harrell et al. | 355/85 |
| 3,751,164 | 8/1973 | Miller et al. | 355/100 |
| 3,813,162 | 5/1974 | Watabe et al. | 355/85 |
| 3,848,998 | 11/1974 | Yonekura et al. | 355/100 |
| 4,070,110 | 1/1978 | Ott | 355/100 |

Primary Examiner—Richard A. Wintercorn
Attorney, Agent, or Firm—Fulwider, Patton, Rieber, Lee & Utecht

[57] ABSTRACT

Method and apparatus for automatically producing finished lithographic plates from supplies of blank plates and negatives. The apparatus provides automatic sequential steps of coating and punching the blank plates, exposing the plates through the negatives, developing and bending the plates, and delivering them to an exit station. Vacuum locks are utilized for registration throughout the apparatus to provide positive registration and prevent injury to the plates or negatives. A vacuum locked registration carriage provides positive registration between a plate to be exposed and a negative and vacuum locks are provided in the exposure station which cooperate with the carriage. The apparatus is completely enclosed to prevent contamination by dust or the like.

19 Claims, 40 Drawing Figures

AUTOMATIC LITHOGRAPHIC PLATE PROCESSOR

BACKGROUND OF THE INVENTION

1. Field of the Invention

The method and apparatus of the present invention is related generally to lithographic plate preparation and, more particularly, to the automatic processing of a blank plate to a finished lithographic plate ready for use.

2. Description of the Prior Art

In the past, lithographic plates were typically prepared from blank plates by coating the plates with photosensitive material in one processing station and exposing them to ultraviolet light through a negative in a second station with the transfer of the plates between the stations manually effected. Following exposure, the plates were then developed to produce a usable image in yet a third station, again with manual transfer between the second and third stations.

The plate was then further processed mechanically, i.e., punched and bent in yet another station, to render them usable in a printing press. While this technique produced finished lithographic plates, the separated stations and the manual transfer of the plates between them often resulted in damage to the plates themselves, such as by scratching or by contamination with dust or the like, which reduced the quality of the finished product and the printed material made with them. Thus, there has been a need in the field of lithographic plate processing for a technique which would, not only increase the speed of production of the finished plates, but which would increase the quality of the finished product. The present invention satisfies that need.

SUMMARY OF THE INVENTION

The present invention provides a completely automatic processing system for producing finished lithographic plates ready for use in a printing press from a supply of blank plates and negatives. The apparatus is a completely closed system requiring no manual intervention at any point in the process thereby substantially reducing the chance of any damage to the plates or negatives and greatly increases the speed at which a finished product can be produced.

Many suppliers of blank lithographic plates interleave the plates with separating tissues to prevent damage to the plates by their rubbing against each other. It is a feature of the present invention that the plates and separating tissues are automatically separated. However, the system will work with plates which are not separated by tissues and a means is provided for breaking the vacuum seal between adjacent plates which typically occurs when no separating tissues are used. Thus, either type of plate supply may be utilized with no adjustments necessary to the system.

It is another feature of the present invention that vacuum locks are utilized for maintaining the position of a plate or negative whenever accurate registration is required, such as for punching, printing or exposure. As there is no mechanical engagement with the plate or negative with such a vacuum lock, there is no possibility of damage to either during the entire process.

Another feature of the invention is that a registration carriage is utilized in the initial registration of a negative with a plate, again maintained by vacuum locks, and the registered plate and negative are transferred by means of the carriage to the exposure station where both plate and negative are transferred to the exposure elements, again by vacuum lock.

Thus, the method and apparatus of the present invention provides a completely automatic and enclosed system for producing finished lithographic plates from a supply of blank plates, with or without tissue separators, and negatives with vacuum locks provided throughout for registration, including a carriage providing initial registration between a plate and a negative to provide positive registration but without damage to the plates or negatives.

These and other features of the present invention will become apparent from a consideration of the detailed description of the drawings below.

DESCRIPTION OF THE PREFERRED EMBODIMENT

Figure 1:
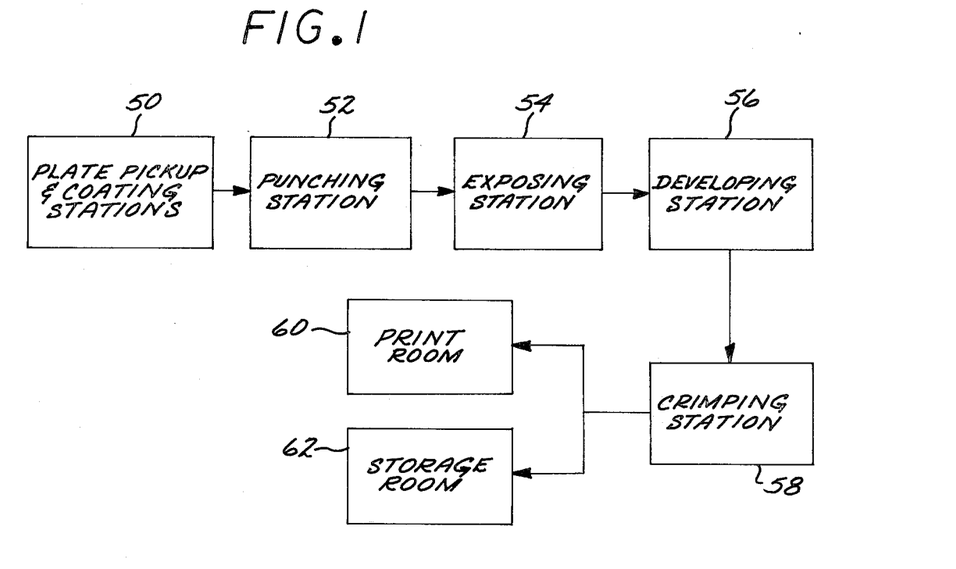
FIG. 1 is a block diagram of the sequential processing provided by the system of the invention.

Referring to FIG. 1, which is a block diagram, this figure illustrates the sequential operations performed in a typical lithographic plate processing technique which are automatically performed by the method and apparatus of the invention. In particular, lithographic plates are typically supplied in stacks with or without the plates being separated by tissue separators. Therefore, the plates must be first separated into individual ones before they can be further processed. Each plate is then coated with a diazo fluid, which is photosensitive, and dried, resulting in a photosensitive plate. These operations are represented by the separating and coating block 50 of FIG. 1.

Typically, the photosensitive plates are then punched with holes along two opposite edges which will mate with the indexing pins on the printing press in which they will be used. This step is illustrated by the punching block 52 of FIG. 1.

The punched plates are then overlaid with a negative of the image to be reproduced and exposed to relatively intense ultraviolet light as illustrated by the exposing block 54 of FIG. 1. The exposed plates are then developed in a scrubbing, washing and gum coating technique which results in a lithographic plate which can be used for printing as illustrated by the developing block 56 of FIG. 1. The punched edges of the plates are then bent at a 90 degree angle so that they will engage the indexing pins on the printing press as illustrated by the bending block 58 of FIG. 1. The plates which are now ready for use are either sent directly to a print room 60, or to a storage room 62, for later use when the correct number of plates have been accumulated.

All of the sequential operations illustrated in FIG. 1 are automatically performed by the lithographic plate processor of the present invention. Furthermore, several of the steps illustrated include novel features which permit the process to be performed automatically and substantially without failure. In this regard, the plate separating mechanism is adaptable for both tissue separated plates and those that are not. For tissue separated plates, the mechanism not only removes and transports a plate to a conveyor leading to the coating station, but also determines whether a tissue is present and, if so, removes it, exposing the next plate. The coating and drying stations are novel in that the bottom side of the plate originally on the conveyor is the side that is coated with the diazo fluid. This technique results in a greatly simplified coating mechanism reducing the possibility of problems or failures. Since the bottom of the plate is coated, the plate is passed through a reversing loop which results in its being placed on a second conveyor into the dryer with the coated side up. The dryer is unique in that a single drying apparatus is used but the plate is passed through it twice in order to conserve space and blower power requirements.

In the punching station of the apparatus, the plate is passed onto a punching bed and registered by means of relatively lightweight pins which merely position the plate. A vacuum lock plate on a registration carriage then engages the plate and maintains it in a fixed position with relatively strong force but which does not damage or harm the plate in any way. Following punching of the plate, the same vacuum lock mechanism on the carriage which maintains it in position during punching also carries registered negatives on its topside and transports both the registered negative and plate to the exposing station which vacuum locks the negative in a negative carrier and vacuum locks the plate to an exposure bed. Thus the registration carriage delivers the registered negative and plate to two exposure elements which have no registry capabilities of their own.

The registration carriage then returns to the punching station to repeat the procedure. The exposing station also has a unique device for removing the negative from the underside of the negative carrier. Vacuum cups grip the underside of the negative and pull it off of the negative carrier and deposit it in a collection tray while the plate is moved through an orienting conveyor into the developing station which develops the exposed plate into a useful image for lithographic printing. The plate then moves into a bending station which also utilizes a vacuum lock technique to positively fix the plate into position during bending but which does not damage the plate. The plate is then transported out of the apparatus to a location where it is either collected or utilized immediately.

Figures 2, 3:
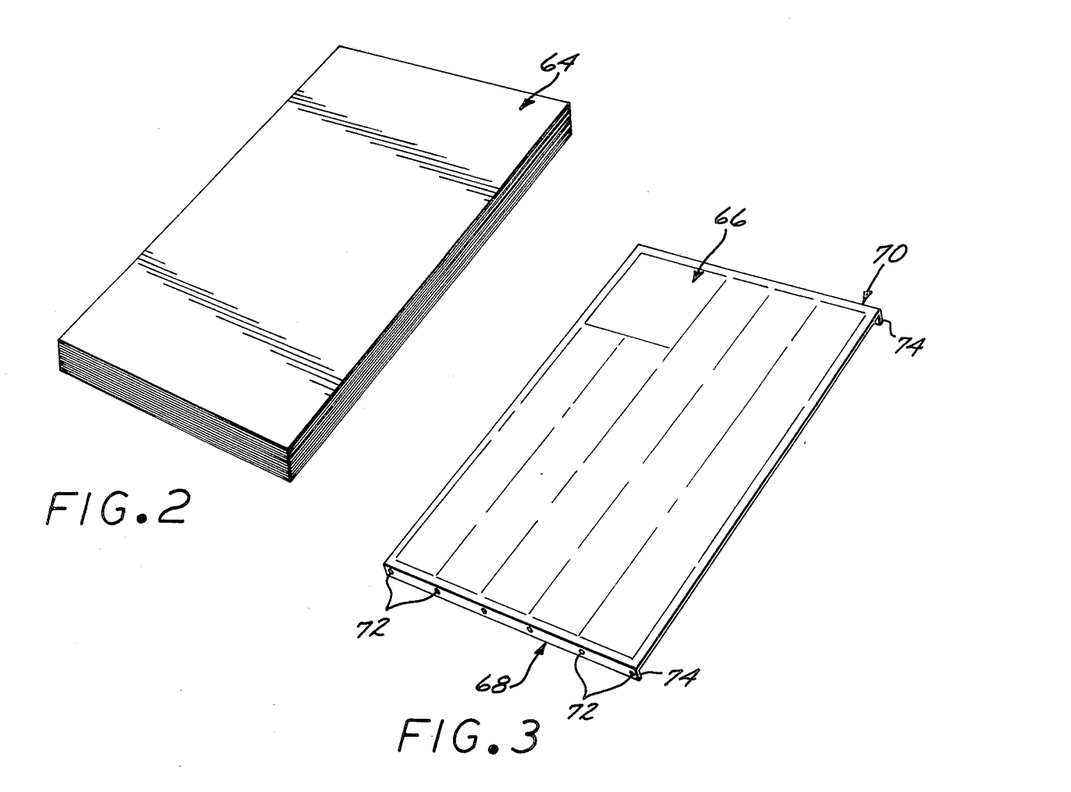
FIG. 2 is a perspective view of an initial supply of blank plates.
FIG. 3 is a perspective view of the desired finished lithographic plate ready for use in a printing press.

FIG. 2 is an illustration of a typical stack of blank plates 64 as they are supplied for use with the plate processing system of the invention. The individual plates in the stack may or may not be separated by a tissue paper separator. The tissue separators typically service two functions. The first is to protect the surfaces of the plates as any scratches placed thereon as a result of the plates rubbing together can affect the quality of the finished image. Additionally, since the plates are relatively thin and have a highly polished surface, vacuum seals between the plates develop and separating the plates is often difficult. The presence of the tissue separator inhibits the formation of that vacuum seal.

Manual handling of the blank plates 64 often results in fingerprints on the side of the xx plate which is to be coated and this can also affect the quality of the finished image as the coating to be applied may not adhere to the plate surface properly. Additionally, manual handling of the blank plates 60 is a tedious and time consuming operation.

FIG. 3 is an illustration of a desired finished plate 66. The plate has been coated, exposed and developed to produce a final image and, additionally, opposite ends 68 and 70 have been punched with holes 72 to accommodate the printing press on which the plate is to be used and the ends 68 and 70 also bent as illustrated at 74, also to accommodate the printing press. The lithographic plate processor of the invention starts with the stack of blank plates 64 and produces the final resultant plates 66 in one continuous process which does not require manual operations. Thus, the integrity of the blank plates is not affected by fingerprints or scratches introduced by manual handling of the plates from station to station during the process. Once a stack of blank plates 64 is loaded into the processor, the integrity of the atmosphere in which the plates are handled is maintained by completely enclosing the processor.

SEQUENTIAL OPERATION OF THE SYSTEM

The sequential operation of the system of the invention involves the transfer of a plate from station to station where the various operations outlined above in FIG. 1 are performed. It should be appreciated that at any given moment, more than one plate is being processed and that the sequential station operations require different time periods for completion. Therefore, conventional automatic stops are provided to prevent interference between plates. These stops, as well as all of the actual operations performed in the stations, are controlled by limit switches, relays, solenoid valves, and the like, conventionally connected together to effect the desired sequential operation. The plates are transported through the various stations by means of vacuum cups and conveyors, all of which operate in a conventional manner, and are controlled by the actuation of limit switches and the like.

PLATE PICKUP STATION

Figure 4:
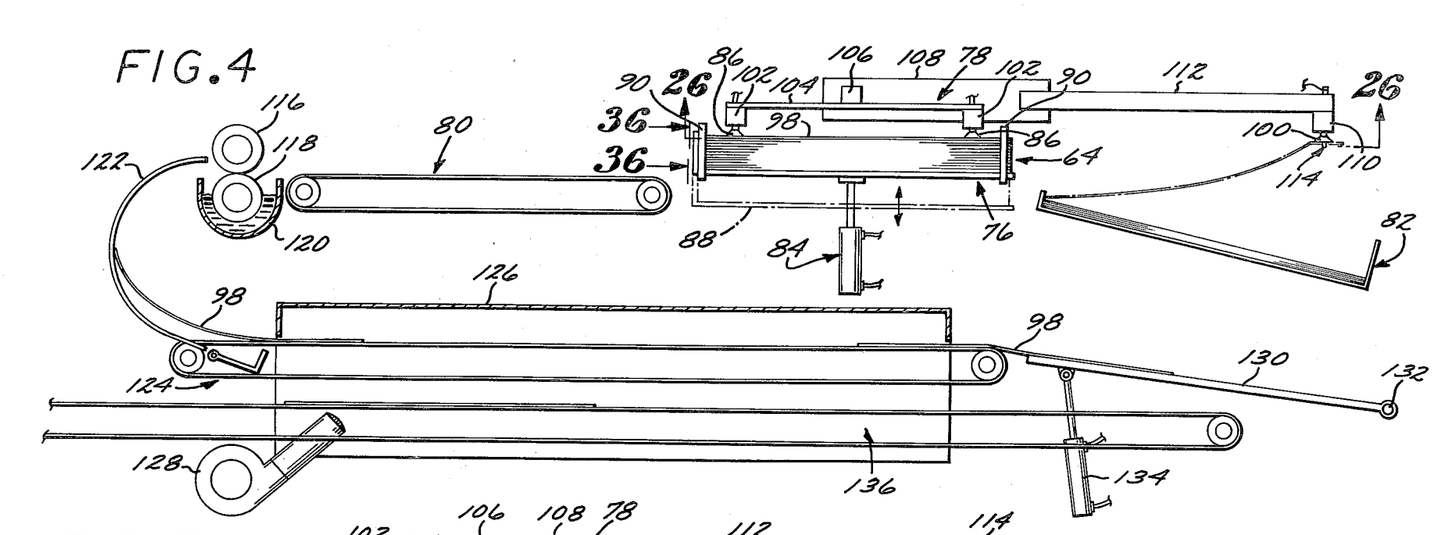
FIG. 4 is a diagrammatic plan view of the plate pickup, coating and drying stations of the apparatus of the invention, shown with a plate in the process of being picked up.
Figure 5:
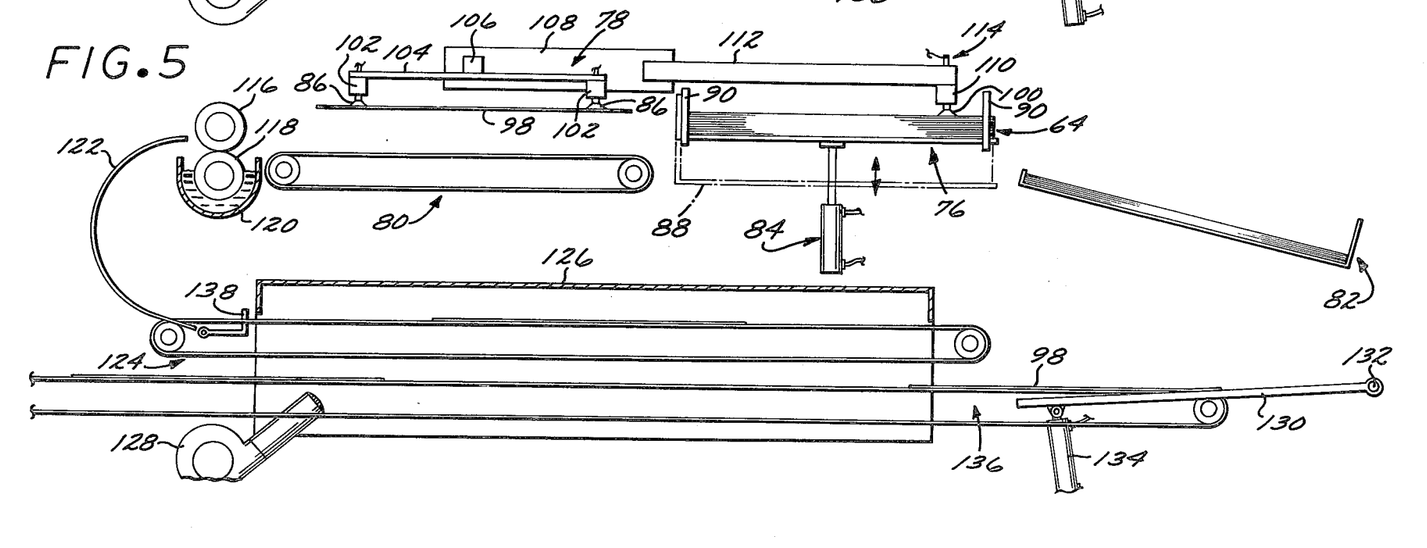
FIG. 5 is a view of the apparatus similar to FIG. 4 shown with a plate being delivered to the coating station and a tissue separator being pick up.
Figure 36:
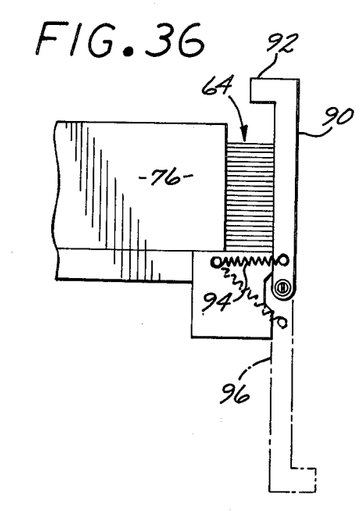
FIG. 36 is a fragmentary view of the deleafing mechanism utilized in the invention.
Figure 37:
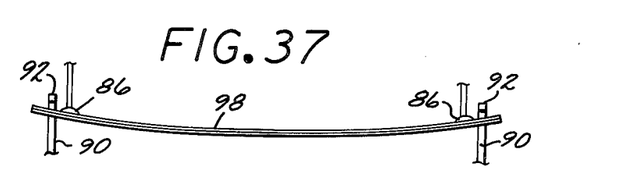
FIG. 37 is a diagrammatic view of a pair of vacuum sealed plates as they are being picked up.
Figure 38:
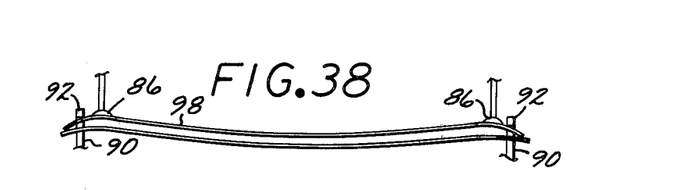
FIG. 38 is a diagrammatic view similar to FIG. 37 showing the operation of the deleafing mechanism to break the vacuum seal between the plates.

FIGS. 4 and 5 illustrate the operation of the plate pickup station. The plate pickup station includes a plate tray 76, a pickup carriage 78, a coating conveyor 80 and a paper receiving tray 82. In operation, a stack of blank plates 64 is loaded onto the tray 76 and the system is started. The plate tray 76 is then moved upwardly by means of a pneumatic cylinder 84 until a top plate 98 in the tray engages a set of plate pickup vacuum cups 86 which also actuates a suitable microswitch (not shown) to both deactivate the pneumatic cylinder 84 and to apply a vacuum to the vacuum cups 86. The plate tray 76 is then moved downwardly, again by the pneumatic cylinder 84, to its initial position as illustrated by the phantom outline 88. As the plate tray 76 moves downwardly, the top plate 98 which is held by the vacuum cups 86 remains in place and a pair of vacuum break arms 90 engage the edge of the held plate as is more clearly illustrated in FIG. 36. As is shown in FIG. 36, the vacuum break arms 90 include a finger 92 which overlies the edge of the stack of plates 64 and is spring biased by means of the spring 94 into engagement with the edges of the plates 64. For ease of loading and unloading, the break arms 90 may be rotated to the opposite position as illustrated by the phantom arm 96. The function of the vacuum break arm is to break the vacuum seal between two or more adjacent plates should they be picked up together. This operation is illustrated diagrammatically in FIGS. 37 and 38, which show a pair of plates 98 being picked up by the vacuum cups 86 and moved past the break arms 90. FIG. 38 illustrates that when the fingers 92 of the break arms 90 engage the edges of the vacuum sealed plates 98, a slight flecture is imparted thereto which breaks the vacuum seal and permits the bottom plate to drop back into the tray 76. It should be appreciated that this operation is only needed if the stack of plates 64 does not have the alternating tissue separators. If the stack 64 does include the tissue separators, the single picked up plate 98 is merely flexed.

Returning to FIGS. 4 and 5, when the plate tray 76 has returned to its initial position 88, the plate pickup carriage 78 is moved toward the coating conveyor until a stop is reached, as illustrated in FIG. 5. The plate pickup vacuum cups are then deactivated and the picked up plate 68 drops onto the coating conveyor 80. Simultaneously with the plate pickup carriage 78 reaching its stop position, the plate tray 76 is moved upwardly by the pneumatic cylinder 84 until the remaining tissue separator on top of the stack of blank plates 64 engages paper vacuum cups 100 which is activated to hold the tissue separator. Activation of the paper vacuum cups 100 also causes the plate tray 76 to be moved downwardly by pneumatic cylinder 84 to its initial position 88. The pickup carriage 78 then returns to its initial position while the paper vacuum cups 100 pull the tissue separator out of the plate tray 76 and over the paper receiving tray 82. When the pickup carriage 78 reaches its initial position stop, the paper vacuum cups 100 are deactivated and the tissue separator drops into the paper receiving tray 82. It should be appreciated that while the pickup carriage 78 is being returned to its initial position, the coating conveyor 80 is simultaneously conveying the plate 98 into the coating station. It should therefore be appreciated that when the plate pickup carriage 78 returns to its initial position, the plate tray 76 is again moved upwardly by the pneumatic cylinder 84 so that another plate may be picked up. Thus, the operation of picking up a plate and delivering it to the coating conveyor 80 may be a substantially continuous process.

Figure 26:
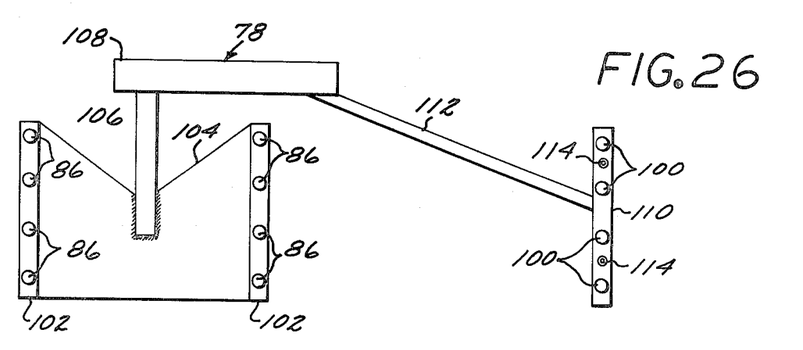
FIG. 26 is a diagrammatic plan view of the plate pickup mechanism taken in the direction of lines 26—26 of FIG. 4.

A diagrammatic bottom view of the plate pickup carriage is shown in FIG. 26. The plate pickup vacuum cups 86 are mounted on a pair of carriers 102 placed on the underside of a support plate 104 which is in turn mounted on a support arm 106 extending outwardly from a car 108 which rides on the support rails (not shown). The paper pickup vacuum cups 100 are also mounted along a support bar 110 which is on the end of an arm 112 fixed to the car 108. In addition to the vacuum cups 100 on the bar 110, a pair of paper sensors 114 are mounted for sensing whether the supply of stacked blank plates 64 with separating tissues has been exhausted. When the plate tray 76 moves upwardly with the paper vacuum cups in position to pick up a separating tissue, the two sensors 114 contact the paper. If a separating tissue is present, a circuit between sensors 114 is not closed and is an indication that the supply of blank plates 64 has not been exhausted. However, if the sensors 114 contact the bottom of the plate tray 76, an electrical circuit between the sensors is closed and is an indication that the supply of plates 64 has been exhausted and the system is turned off. If a stack of plates 64 does not have the separating tissues, the operation of the sensors 114 is inhibited.

Figure 35:
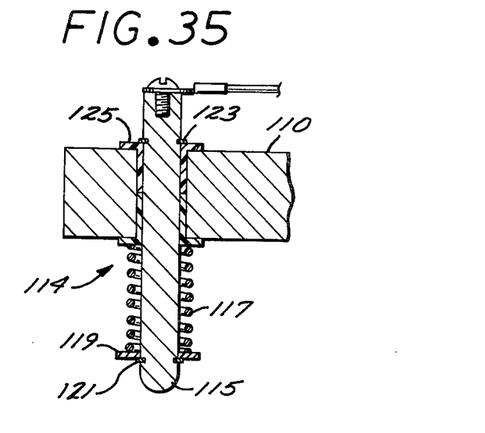
FIG. 35 is a fragmentary sectional view of the separating tissue sensor for sensing the presence of a separating tissue.

Details of a sensor 114 are shown in cross section in FIG. 35. An elongated contact 115 is biased by means of a spring 117 restrained by washer 119 and snap lock 121 into a downward position limited by snap lock 123. The contact 115 slides within a bushing 125 and, when the contact engages a plate or separating tissue, it slides upward but remains in contact therewith.

COATING AND DRYING STATION

Figure 34:
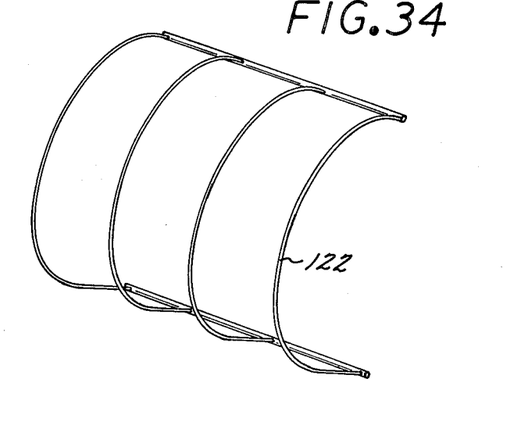
FIG. 34 is a perspective view fo the reversing mechanism utilized in the coating and drying stations of the invention illustrated in FIGS. 4 and 5.

The coating conveyor 80 transports a blank plate to a coating device which includes a top pressure roller 116 and a bottom coating roller 118. The roller 18 rides in a trough 120 filled with diazo fluid. As the blank plate 98 passes between the rollers 116 and 118, its bottom surface is coated with the diazo fluid. This technique is in contrast with the typical method of coating the top of the plate. By coating the bottom of the plate, the complicated supply and coating rollers normally encountered in prior art coating mechanisms are eliminated. As the plate emerges from between the rollers 116 and 118 with its bottom surface coated, it is deflected by a reversing loop 122 and slips onto a first stage dryer conveyor 124. One embodiment of a reversing loop 122 is shown in FIG. 34. This is an open wire loop which prevents any sticking or binding of the relatively flexible plate as it traverses the loop.

The first stage drying conveyor 124 extends the length of a drying baffle 126 which is enclosed at the top and open at the bottom and a blower 128 has its output directed upwardly against the top of the baffle to disperse it over the plates on the first stage conveyor 124. The first stage conveyor exits onto a reversing tray 130 pivotal about a point 132 and actuated by a pneumatic cylinder 134. As the plate 98 is fed onto the reversing tray 130, its leading edge reaches a limit which actuates the pneumatic cylinder 134 to pivot it downwardly into the position shown in FIG. 5. In this position, a second stage conveyor 136 picks up the plate 98 and reverses the direction of travel through the dryer baffle 126. Thus, the plate 98 to be dried actually traverses a considerable distance through a drying atmosphere but the dryer baffle 126 itself is of reasonable dimensions. By using the first and second stage conveyors through the drying baffle 126, space is conserved as well as the heat required from the blower 128.

If the first and second stage conveyors 124 and 136 should be stopped for some reason, such as repetitive activity in the exposure station, a pivotal stop 138 will be raised at the output of the reversing loop preventing that plate from sliding onto the first stage conveyor 124. As the dried plate exits the drying baffle 126 on the second stage drying conveyor, it is transported to the punching station.

PUNCHING STATION

Figure 6:
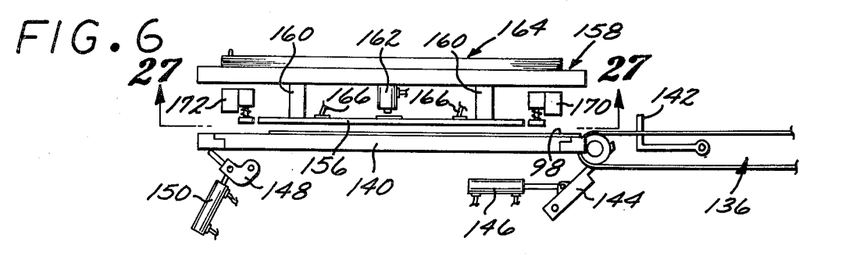
FIG. 6 is a diagrammatic plan view of a plate being delivered to the punching station shown with the registration carriage in position to receive the plate.
Figure 7:
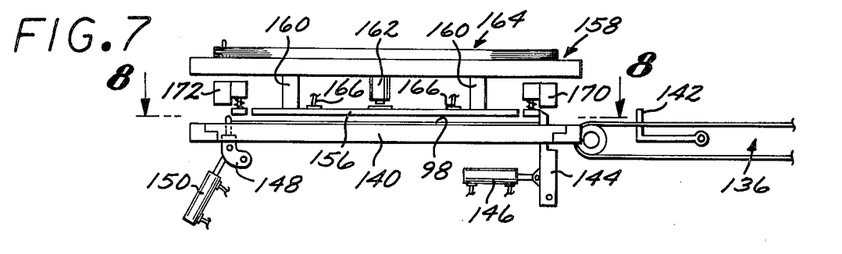
FIG. 7 is a view similar to FIG. 6 shown with the plate being initially registered for punching.
Figure 8:
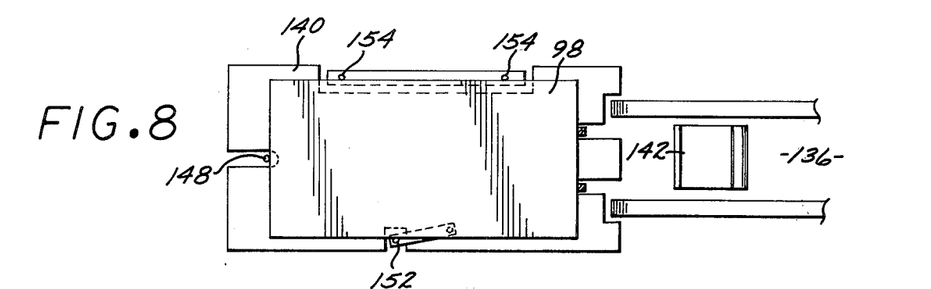
FIG. 8 is a top view of the registering mechanisms utilized in the punching station.

The operation of the punching station is illustrated in FIGS. 6–10. In FIG. 6, the plate 98 is shown being moved onto a punching bed 140 from the second stage drying conveyor 136. Following the delivery of the plate 98 to the bed 140, a plate stop 142 prohibits another plate from being delivered to the punching station 52. As the plate 98 moves onto the punching bed 140, conventional limit switches are encountered which cause the actuation of a plurality of alignment pins which accurately position the plate 98 on the punching bed but which do not exert any holding force on the plate.

Thus, a pair of pivotal rear alignment pins 144 are brought into their alignment position by means of a pneumatic cylinder 146 and a pivotal front alignment pin 148 is also moved into its alignment position by means of another pneumatic cylinder 150. In a similar manner, a pivotal side alignment pin 152 is moved into its alignment position by means of a pneumatic cylinder (not shown) and moves the plate 98 against a pair of fixed side alignment pins 154.

Figure 9:
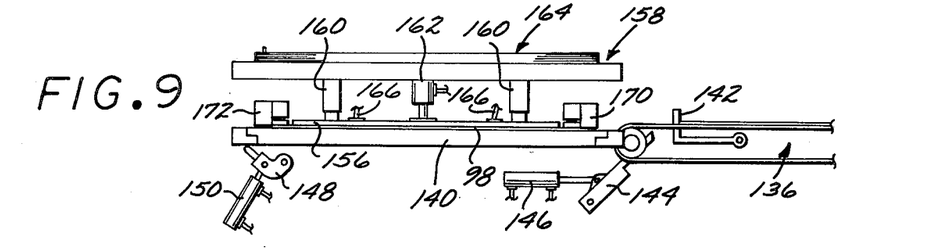
FIG. 9 is a view similar to FIG. 7 shown with the registration carriage engaging the plate while it is punched.

Once the plate 98 is aligned on the punching bed 140, a vacuum locked plate carrying platen 156 is moved downwardly from a registration carriage 158 into engagement with the plate 98 (FIG. 9). The plate carrying platen 156 is spring biased upwardly within telescoping columns 160 and is moved downwardly by means of a pneumatic cylinder 162.

The registration carriage 158 cooperates with the alignment pins 144, 148 and 152 associated with the punching bed 140 to provide registration between the aligned plate 98 and a plurality of stacked and aligned negatives 164 positioned on top of the registration carriage. Thus, when the registration carriage 158 is in a first or punching position, the negatives 164 and plate 98 are aligned and registered.

Figure 27:
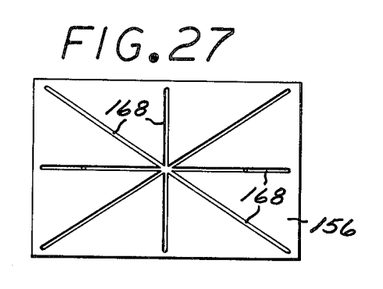
FIG. 27 is a plan view of the plate pickup portion of the transfer carriage shown in the direction of lines 27—27 of FIG. 6.

When the plate carrying platen 156 is in position on top of the plate 98, vacuum is applied to vacuum ports which, as can be seen in FIG. 27, cooperate with grooves 168 on the plate side of the platen to create a vacuum lock between the platen and the plate to fix the plate 98 in position for both punching and also to fix the registration between the plate and the negatives 164.

Figure 10:
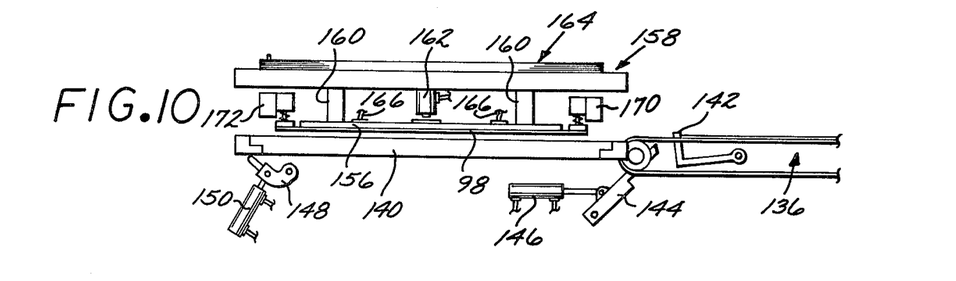
FIG. 10 is a view similar to FIG. 9 shown with the registration carriage picking up the registered plate following punching.
Figure 11:
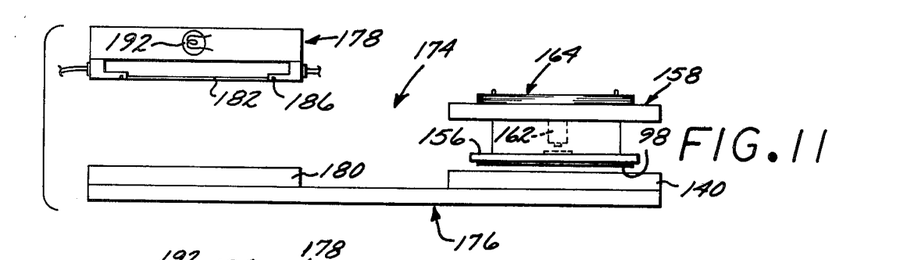
FIG. 11 is a diagrammatic end view of the exposure station and the registration carriage shown with registered negatives and a plate.

The positioning pins 144, 148 and 152, as well as the fixed positioning pins 154, are then pivoted, by means of hydraulic cylinders 146 and 150, away from the punching bed 140, as shown in FIGS. 9 and 10. A set of punches 170 and 172 at either end of the plate are then actuated to punch the alignment holes along the edge of the plate 98. Following punching, the pneumatic cylinder 162 is deactivated allowing the plate carrying platen 156 and carried plate 98 to be lifted off of the punching bed 140. At this point, the stop 142 may be dropped allowing another plate to enter the punching station. The registration carriage with the carried plate 98 and stack of negatives 164 is then transported to the exposure station.

EXPOSURE STATION

The operation of the exposure station is illustrated in FIGS. 11-15. It should be appreciated that, at this point, the registration between the negatives 164 and the plate 98 is fixed by the operation of the vacuum lock on the registration carriage 158 and both are transported in registry by the registration carriage into the exposure station.

Figure 12:
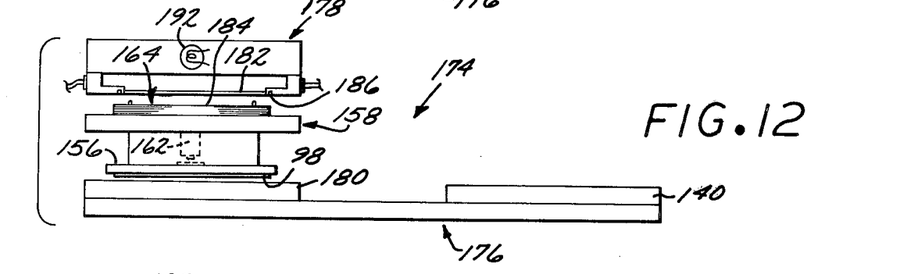
FIG. 12 is a view similar to FIG. 11 shown with the registration carriage in position in the exposure station.
Figure 13:
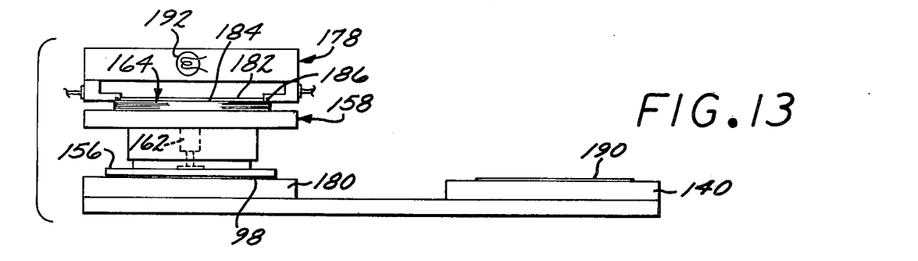
FIG. 13 is a view similar to FIG. 12 shown with the exposure elements engaging a registered negative and the plate.

The registration carriage 158 may be moved into and out of the exposure station by any suitable and conventional means, such as the carriage being mounted on rails, as illustrated in phantom at 174, and moved by means of the cam lever illustrated in phantom at 176. The registration carriage 158 is moved into the exposure station until a conventional stop is reached which positions the carriage between a negative carrier 178 above the negatives 164 and an exposure bed 180 below the held plate 98, as illustrated in FIG. 12. The pneumatic cylinder 162 is then activated, moving the plate carrying platen 156 downwardly to position the plate 98 on the exposure bed 180.

Concurrently, the negative carrier 178 is moved downwardly by any suitable means (not shown) until a glass plate 182 makes contact with the top negative of the stack of negatives 164.

Figure 29:
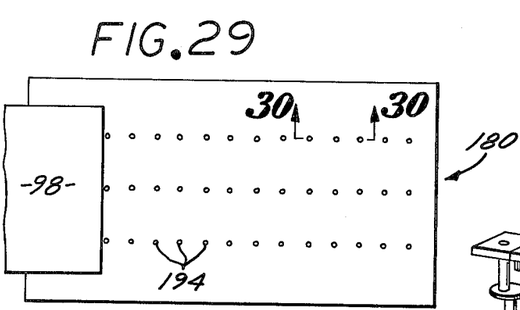
FIG. 29 is a plan view of the plate exposure platen taken in the direction of lines 29—29 of FIG. 19.

The exposure bed 180 is also provided with a vacuum lock, the top surface of which is illustrated in FIG. 29, and when the plate 98 is positioned on the bed by the platen 156, the exposure bed vacuum lock is activated and the vacuum lock on the platen 156 is deactivated. In this manner, the plate is transferred from the registration carriage 158 to the exposure bed without changing its relative position with respect to the negatives 164. When the negative carrier 178 is in position over the top negative 184 of the stack of negatives 164, peripheral vacuum locks are activated on the negative carrier which locks the negative in position on the glass plate.

Figure 28:
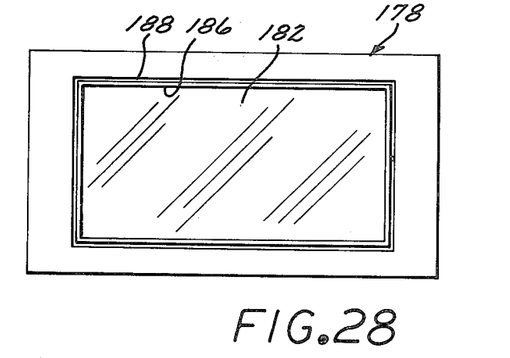
FIG. 28 is a view of the negative pickup mechanism shown in the direction of lines 28—28 of FIG. 19.

A configuration for the vacuum lock for the negative is illustrated in FIG. 28 which shows an inner and outer peripheral groove 186 and 188, respectively, around the glass plate. The inner peripheral groove 186 vacuum locks the negative 184 in position on the glass plate 182. The outer peripheral groove 188 serves to vacuum lock the negative to the plate for exposure, as will be described below.

Figure 14:
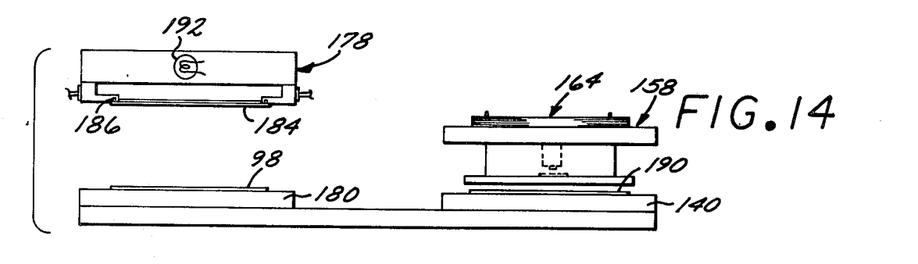
FIG. 14 is a view similar to FIG. 13 shown with the registered negative and plate vacuum locked within the exposure station.

When the plate 98 is vacuum locked to the exposure bed 180 and the negative 184 is vacuum locked to the negative carrier 178, both are locked in the registry which was initially maintained by the registration carriage 158. The pneumatic cylinder 162 is then deactivated, raising the plate carrying platen 156 away from the plate 98 and the negative carrier 178 is raised, lifting the negative 184 off the top of the stack of negatives 164. The registration carriage 158 is then moved back to the punching station, as illustrated in FIG. 14, where another plate 190 may be positioned and waiting for the vacuum locking and punching operations.

Figure 15:
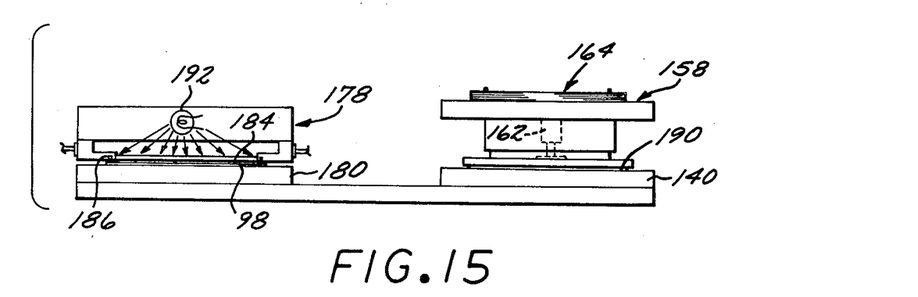
FIG. 15 is a view similar to FIG. 14 shown with the exposure station elements exposing the plate.

The negative carrier 178 is then moved downwardly until the negative 184 is in contact with the plate 98, as illustrated in FIG. 15. In order to eliminate any air spaces between the negative and plate, a vacuum is applied to the peripheral groove 188 (FIG. 28) to vacuum lock the negative to the plate for exposure. A high intensity ultraviolet lamp 192 is then activated for a predetermined time period which may be fixed, or dependent upon the density of the negative 184. While the plate 98 is being exposed, the registration carriage may be repeating the punching operation for the plate 190, as was described above. Following exposure of the plate 98, the vacuum lock on the outer peripheral groove 188 is released and the negative carrier 178 and carried negative 184 is raised to its initial position, as illustrated in FIG. 14.

Figure 30:
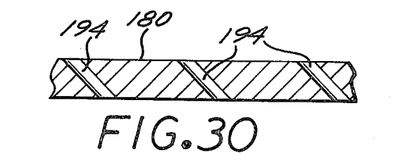
FIG. 30 is a fragmentary sectional view of the plate exposure platen taken in the direction of lines 30—30 of FIG. 29.

If a single plate is to be exposed to a single negative, both the negative and plate are then removed. However, in some applications where multiple presses may be employed, a plurality of plates may be exposed to a single negative in which case the negative 184 would remain in place and only the plate 98 removed from the exposure station. The removal of either the plate alone or both the plate and negative from the exposure station is illustrated in FIGS. 16-19. The plate 98 is removed from the exposure station by releasing the vacuum lock between the plate and the exposure bed 180 and applying a positive and moving air flow to the bottom of the plate which causes it to move across the exposure bed and onto a conveyor to the developing station. The construction of the exposure bed 180 is illustrated in FIGS. 29 and 30, which show the bed as having a plurality of aligned air vents 194, a portion of which are seen in cross section in FIG. 30.

During exposure, a vacuum is applied to the vents 194 to vacuum lock the plate in position on the exposure bed 180. When the plate 98 is to be transferred to the developing station, the vacuum is released and a positive air pressure applied to the vents 194. As can be seen in FIG. 30, the air vents 194 are inclined through the plate so that the positive air flow which strikes the plate 98 is inclined and tends to move the plate 98 in the same direction as the inclined vents 194. If a number of plates are to be exposed to the same negative 184, the registration carriage 158 will then transport an unexposed plate, such as plate 190, to the exposure station and the platen 156 will place the plate on the exposure bed 180 but the negative carrier will not be brought down to pick up another negative. This process can be repeated any number of times.

Figure 40:
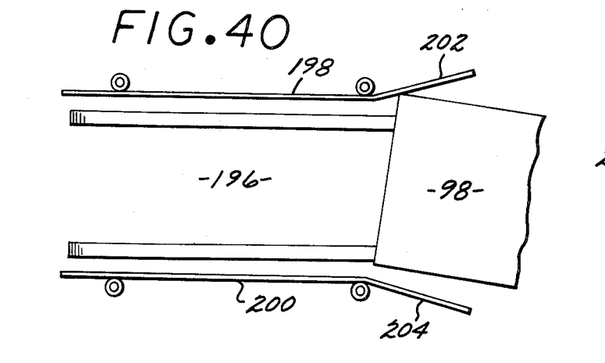
FIG. 40 is a diagrammatic view of the plate alignment mechanism utilized for aligning a plate for delivering to the developing station taken in the direction of lines 40—40 of FIG. 19.

When both the plate 98 and the negative are to be removed from the exposure station, the plate 98 is moved toward a developing conveyor 196 which then conveys the plate to the developing station. As the plate 98 may be misaligned as it is moved off of the exposure bed 180 under the moving air stream, a pair of alignment guides 198 and 200 are provided at the sides of the carrier which has a V-shaped opening provided by angled sections 202 and 204 which engage the leading edge of the plate 98 and guide it into alignment on the developing conveyor 196, as illustrated in FIG. 40.

As the plate 98 is being removed from the exposure bed 180, the negative 184 is removed from the negative carrier by means of a pickup arm 206 and is deposited in a negative collection tray 208. The position of the pickup arm 206 during exposure is illustrated in FIG. 16 and, while the negative carrier 178 is in its lowered or exposure position, the negative pickup arm 206 is pivoted about a point 210 to a retracted position.

Figures 16, 17:
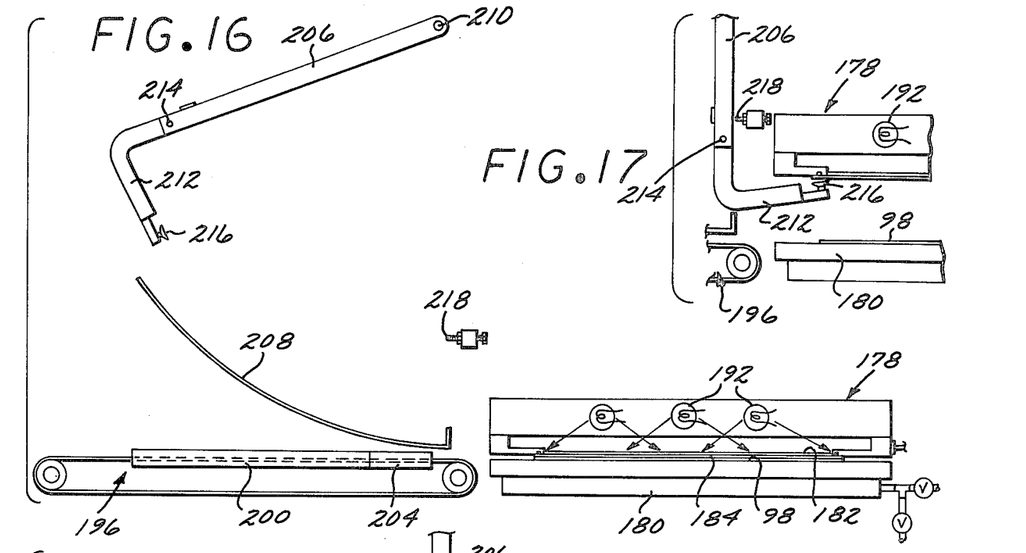
FIG. 16 is a diagrammatic plan view of the exposure station and associated mechanism for removal of the negative therefrom and transfer of the plate to the developing station.
FIG. 17 is a fragmentary view of the negative removal mechanism initially engaging a negative.
Figure 18:
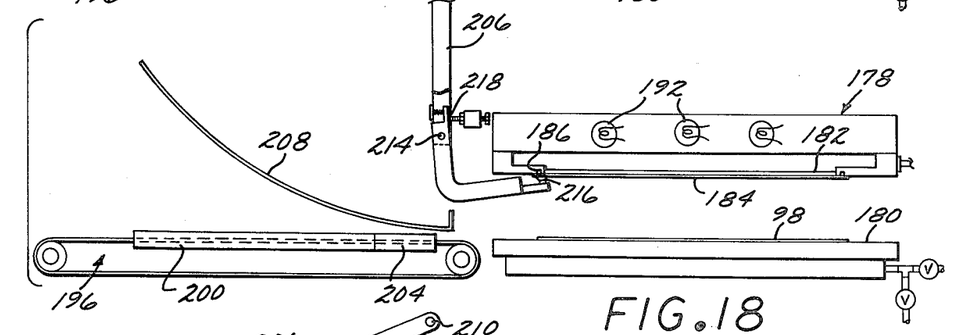
FIG. 18 is a diagrammatic side view of the negative removal mechanism in position for removing the negative.
Figure 39:
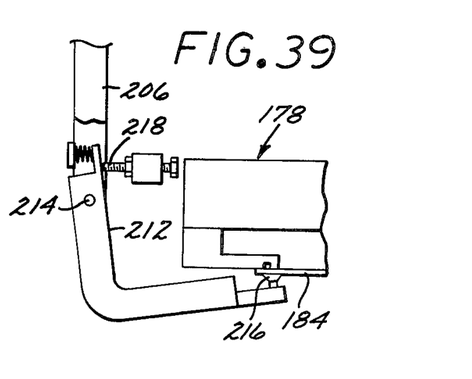
FIG. 39 is an enlarged fragmentary view showing the operation of the negative pickup arm as it engages a negative.

In removing a negative 184 from the raised negative carrier 178, the pickup arm 206 is pivoted about point 210 in a downward direction so that an angled arm 212 is inserted under the negative carrier 178, as illustrated in FIG. 17. The angled arm 212 is pivotal with respect to the pickup arm 206 about a point 214 and is spring biased to a first position as is shown in FIG. 17. In this position, a vacuum cup 216 on the end of the angled arm is not in the right attitude for making a vacuum contact with the negative 184. Further movement of the pickup arm 206 actuates the pivotal angled arm 212 against a pusher 218 which pivots the angled arm into the correct attitude for a vacuum lock, as illustrated in FIG. 18, and in greater detail in FIG. 39.

Figure 19:
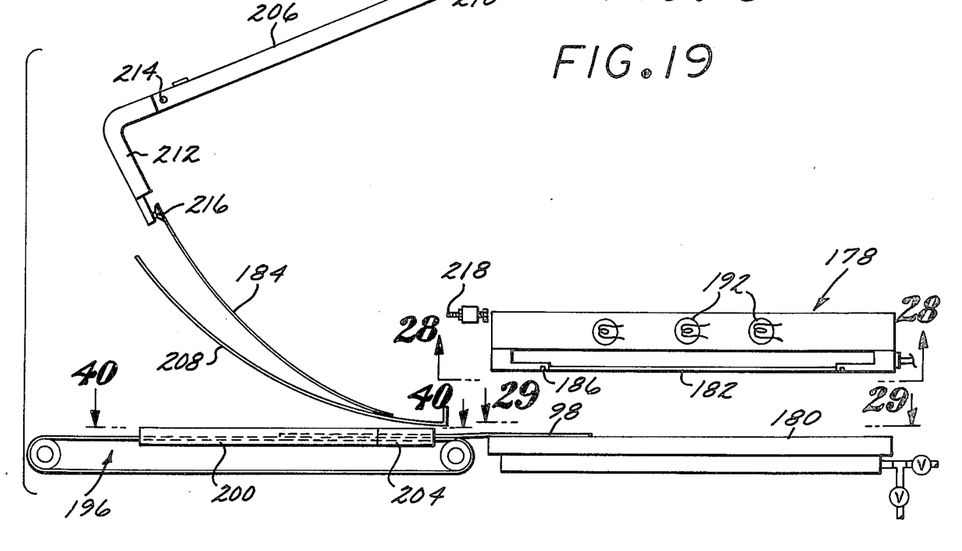
FIG. 19 is a diagrammatic side view of the removal of the negative and transfer of the plate to the conveyor leading to the developing station.

A vacuum is applied to the vacuum cup 216 to securely grip the negative 184 and then the vacuum lock on the negative carrier 178 is turned off releasing the negative which is then pulled out from between the negative carrier 178 and the exposure bed 180 and into position above the negative collection tray 208, as illustrated in FIG. 19. The vacuum on the cup 216 is then released allowing the negative 184 to fall into the collection tray.

DEVELOPING STATION

Figure 20:
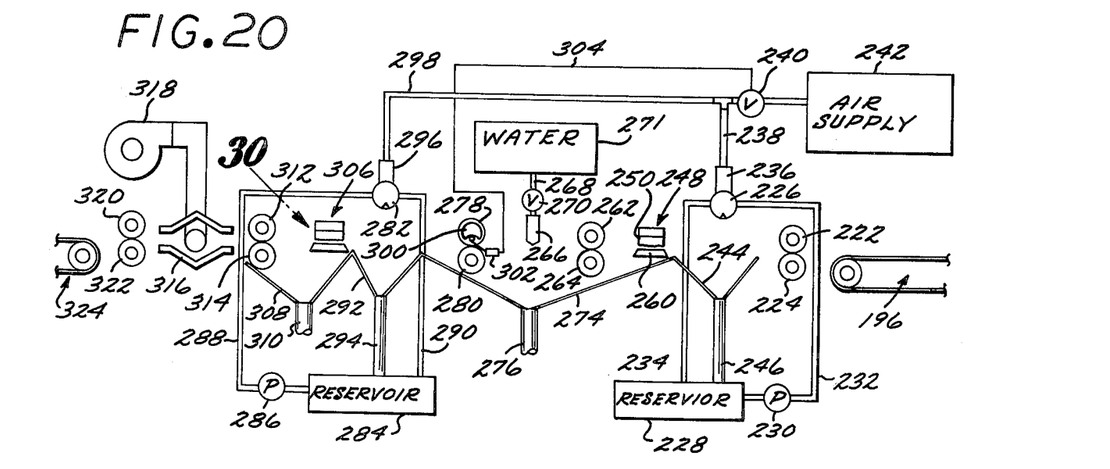
FIG. 20 is a diagrammatic view of the developing station utilized in the system of the present invention.
Figure 21:
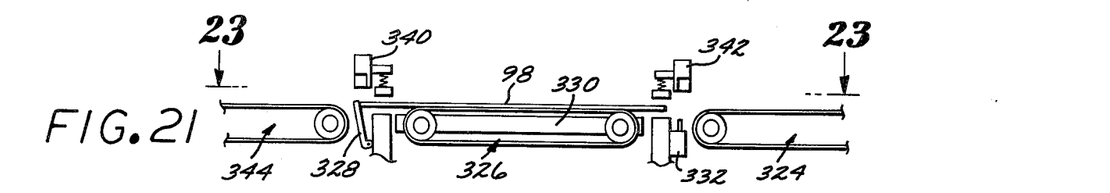
FIG. 21 is a diagrammatic side view of a plate being delivered to the bending station following developing.

Following exposure, the plate 98 is moved onto a developing conveyor 196 as described above, and moved into the developing station which is diagrammatically shown in FIG. 20. Basically, in developing a lithographic plate, an etching solution, such as asphalt gum, is first applied and the plate is scrubbed to remove unexposed coated areas and then, following a water rinse, a preserving solution such as gum arabic, is also sprayed on and scrubbed into the plate. The plate is then dried by some means such as a hot air blower.

The developing station illustrated in FIG. 20 includes a pair of entry guide rollers 222 and 224 which guide the plate 98 beneath a first fluid dispensing tube 226. The dispensing tube 226 has a continuous flow of fluid therethrough provided by fluid reservoir 228 which supplies fluid to a pump 230 and thence through a conduit 232 into the dispensing tube 226. After the fluid flows through the dispensing tube 226, it is returned to a reservoir through another conduit 234. Constant circulation of the fluid through the dispensing tube 226 ensures that the fluid maintains the proper suspension of particles. In the illustrated embodiment, the fluid is dispensed periodically by means of a plurality of metering valves 236 which are pneumatically operated by means of the pneumatic line 238. The periodic operation of the metering valves 236 is controlled by means of a solenoid valve 240 connected to an air supply 242. To prevent loss of fluid, a collecting funnel 244 is provided with a drain conduit 246 back to the reservoir 228. It has been found that the periodic dispensing of the developing fluid results in a more even distribution of the fluid on the plate 98 resulting in more even developing of that plate.

Figures 31, 32:
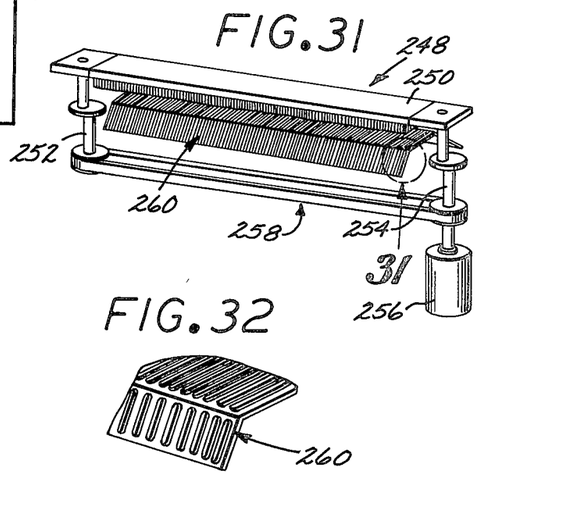
FIG. 31 is a diagrammatic perspective view of a scrubber utilized in the developing station of the invention taken in the direction of the reference arrow 30 in FIG. 20.
FIG. 32 is an enlarged fragmentary perspective view of a support plate utilized in the scrubber taken in the direction of reference line 32 of FIG. 31.

After the fluid is dispensed on the plate 98, it passes through a scrubber 248 which scrubs the developing fluid into the plate to remove unexposed coating. The scrubber is illustrated in more detail in FIGS. 31 and 32 and includes an upper scrubbing element 250 which is eccentrically mounted at its ends on a pair of eccentrically mounted drive shafts 252 and 254, commonly driven by a motor 256 and a pulley and drive belt mechanism 258. The plate 98 is supported during scrubbing by a backing plate 260 which is ribbed, as illustrated in FIG. 32, to prevent the bottom of the plate from sticking to the backing plate.

The scrubbed plate is then passed through another pair of squeeze rollers 262 and 264 to remove excess fluid and the plate is then passed under a water rinser which includes a water sprayer 266 which is connected through a conduit 268 and valve 270 to a water supply tank 271. A trough 274 and drain conduit 276 are provided to catch the rinse water.

The plate 98 then passes through a third pair of squeeze rollers 278 and 280 under a second fluid dispensing tube 282 which operates in the same manner as fluid dispensing tube 226 but which dispenses a different solution, typically gum arabic. Again, a reservoir 284 is provided and has a pump 286 which conducts fluid through a conduit 288 to the fluid dispensing tube 282 with a return conduit 290 returning the circulated fluid back to the reservoir 284. Again, a trough 292 is provided with a conduit 294 back to the reservoir 284. Again, metering valves 296 are pneumatically operated by connection through a pneumatic tube 298 to the output of the solenoid operated valve 240. The solenoid valve 240 is periodically operated electrically by means of a cam 300 mounted on the squeeze roller 278 which cooperates with a cam following switch 302 to electrically operate the valve 240 through a line 304. Thus, the fluid dispensing tubes 226 and 282 are operated simultaneously by pneumatic air pressure controlled by the solenoid valve 240 which is periodically operated by means of the cam 300 and cam following switch 302.

After the plate 98 has passed under the fluid dispensing tube 282, it is passed through another scrubber 306 which operates in the same manner and is constructed in the same manner as the scrubber 248. Again, a trough 308 and drain conduit are provided. After the plate 98 passes through the scrubber 306, it is passed through squeeze rollers 312 and 314 before being passed into a heating baffle 316 which is filled with warm air by means of a heat blower 318 and then through guide rollers 320 and 322 onto a crimping conveyor 324.

The developing station described above is described in more detail in copending application Serial No. 829,645, filed Sept. 1, 1977, now U.S. Pat. No. 4,145,135 issued Mar. 20, 1979.

CRIMPING STATION

Figures 22, 23:
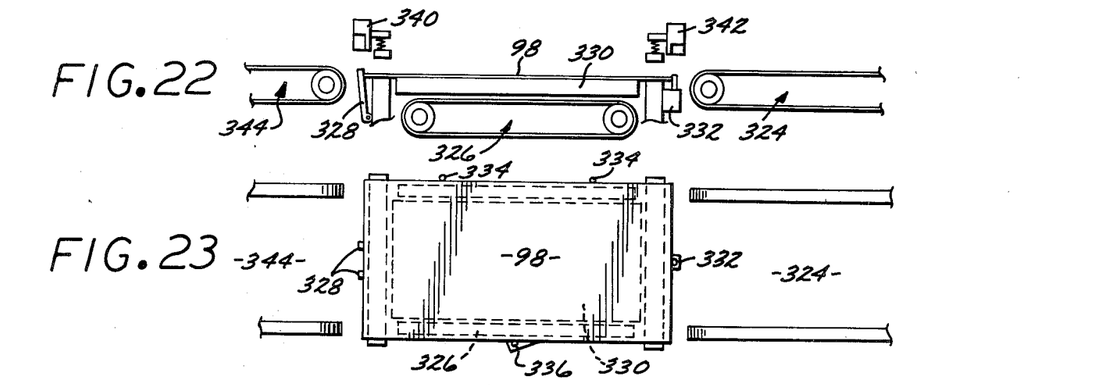
FIG. 22 is a view similar to FIG. 21 shown with the plate being registered and vacuum locked.
FIG. 23 is a diagrammatic plan view of the plate in registered position within the bending station.

The plate 98 is transported to the crimping station by the crimping conveyor 324 and the operation of the crimping station is illustrated in FIGS. 21–25. As the plate passes into the crimping station, it is supported by means of a conveyor 326 which is vertically movable to an upper position illustrated in FIG. 21 which supports the plate 98. The conveyor 326 moves the plate 98 within the crimping station until a pivotal stop 328 is reached which, by some suitable conventional actuating means, causes the conveyor 326 to be moved to its lower position, leaving the plate 98 on a crimping bed 330, as is illustrated in FIG. 22.

Figure 33:
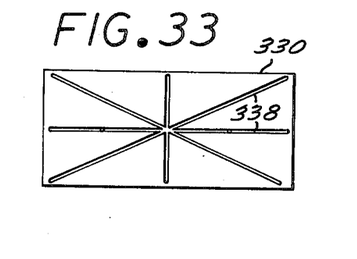
FIG. 33 is a diagrammatic plan view of the vacuum lock table utilized in the bending station taken in the direction of lines 33—33 of FIG. 25.

A forward positioning stop 328 then cooperates with a rearward positioning stop 332, fixed side stops 334, and opposite movable side stops 336 to position the plate 98 within the crimper, as shown in FIG. 23. The crimping bed 330 is also provided with a vacuum lock, as illustrated in FIG. 33, in which a plurality of grooves 338 apply a vacuum to the underside of the plate 98, locking it in position for crimping.

Figures 24, 25:
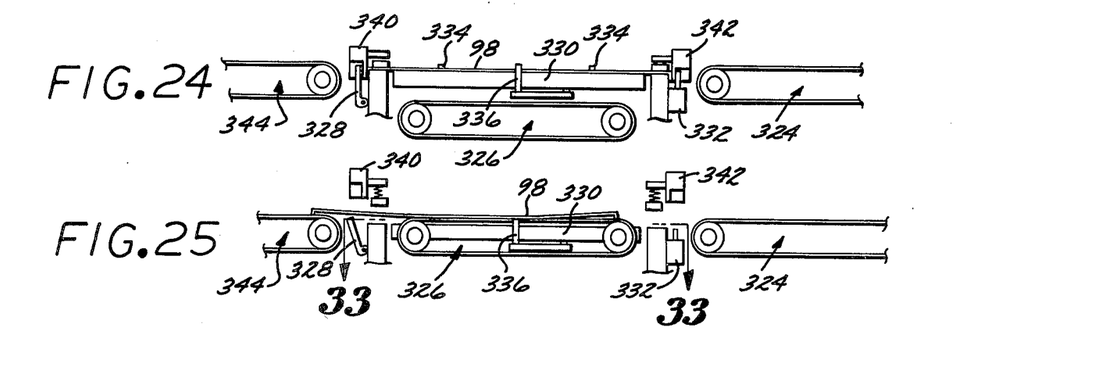
FIG. 24 is a view similar to FIG. 22 shown with the plate bent.
FIG. 25 is a view similar to FIG. 24 shown with the plate being transferred out of the bending station.

Forward and rearward crimping brakes 340 and 342 are then brought down to crimp the ends of the plate, as illustrated in FIG. 24. The crimping brakes 340 and 342 are then raised and the vacuum lock on the crimping bed 330 is turned off and the positioning stops 328 and 332 are lowered and the conveyor 326 raised to lift the crimped plate 98 off the crimping bed 330. The conveyor 326 then transports the plate 98 to an exit conveyor 344 which transports the plate to either the print room or a storage area for further use.

Thus, the automatic lithographic plate processor of the present invention provides a system for producing finished lithographic plates ready for use in a printing press from a supply of blank plates and negatives. There is no need for manual transfer of plates between the plurality of operating stations so the system can be entirely enclosed reducing the possibility of damage to the plates or negatives, and greatly increases the speed at which the finished product can be produced. The system is versatile in that it can utilize both a stack of plates with or without separating tissues and automatic separation is provided.

Whenever accurate registration of a plate or negative is required, such as for punching, printing or exposing, vacuum locks are utilized which greatly reduce the possibility of positioning damage to the plates or negatives. A registration carriage is provided to transport registered plates and negatives from a punching station to an exposing station and transfers of the plate and negative are made within the exposing station, completely by vacuum locks again.

While a presently preferred embodiment has been described above in detail, it should be appreciated that many variations in actual physical structure are possible and the invention is not to be limited, except by the following claims.

I claim:

1. A method of automatically producing finished lithographic plates from a supply of blank plates and a supply of negatives, comprising the steps of:
    picking up a blank plate from said supply of blank plates in a pickup station and placing said plate on a coating conveyor to a coating station;
    coating the underside of said blank plate with a photosensitive fluid in said coating station and then inverting said plate and placing it on a first stage drying conveyor;
    drying said fluid on said plate in a two-stage drying station by passing said plate through a heated air baffle in a first direction on said first stage drying conveyor on a first level and then moving said plate to a second lower level and placing it on a second stage drying conveyor moving in a second direction opposite to said first direction through said heated air baffle and thereafter conveying said plate to a punching station;
    punching at least one indexing hole along the edges of said plate in said punching station by, first, positioning said plate for registration with at least one negative carried by a registration carrier and vacuum locking said plate to said registration carrier, punching said indexing hole and then transporting said registration carrier to an exposing station;
    exposing said plate to said negative in said exposing station by transferring said plate to a vacuum locked exposure bed, transferring said negative to a vacuum locked negative carrier, transporting said registration carrier back to said punching station, vacuum locking said plate with said negative, exposing said plate, disengaging said negative from said exposed plate and placing said plate on a developing conveyor to a developing station;
    developing said exposed plate in said developing station and placing said developed plate on a crimping conveyor to a crimping station; and
    crimping said edges of said plate having said indexing holes in said crimping station by positioning said plate on a crimping bed, vacuum locking said plate on said crimping bed, crimping said edges of said plate, releasing said vacuum lock on said plate and conveying said finished plate to an exit station.

2. The method defined in claim 1 wherein said plate picking up step includes:
    placing said supply of blank plates on a vertically movable plate tray and moving said plate tray upwardly until a top plate of said supply engages a plurality of plate pickup vacuum cups mounted on a horizontally movable plate pickup carriage, said plate pickup carriage having an elongated arm having on its distal end a paper pickup vacuum cup;
    applying a vacuum to said plate pickup vacuum cups to hold said plate; and
    lowering said plate tray to a lower stop position, said plate tray having vacuum arms which engage said held plate as said plate tray is lowered.

3. The method defined in claim 1, wherein said plate picking up step includes:
    stacking said supply of plates on a plate tray vertically movable between a lower stop and a controlled upper position;
    positioning a first end of a plate pickup carriage above said plate tray as an initial position;
    moving said plate tray upwardly until plate pickup vacuum cups on said carriage engage a plate on said tray;
    activating said plate pickup vacuum cups to hold said plate;
    lowering said plate tray to its initial lower stop position;
    horizontally moving said plate pickup carriage to a forward stop position; and
    deactivating said plate pickup vacuum cup to release said plate onto said coating conveyor, said forward position for said pickup carriage positioning a paper pickup vacuum cup carried by an arm on said plate pickup carriage above said plate tray.

4. The method defined in claim 3, wherein said plate picking up step further includes:
    moving said plate tray upwardly until said paper pickup vacuum cups engage a separating paper on said stack of plates on said plate tray;
    activating said paper pickup vacuum cup to hold said separating paper;
    lowering said plate tray to its initial lower limit position;
    moving said plate pickup carriage to its initial position; and
    deactivating said paper pickup vacuum cut to release said separating paper when said plate pickup carriage has returned ot its initial position.

5. The method defined in claim 1, wherein said punching and exposing steps include:
    stacking said supply of negatives on top of said registration carrier, the positional correspondence of said negatives corresponding to a registered position provided by positioning pins which engage said plate on a punching bed;
    lowering a plate platen onto said plate and vacuum locking said plate to said platen during the punching step;
    raising said platen and carried negative and transporting said registration carrier to said exposing station;

moving said registration carrier into said exposure station until a limit stop is reached;

lowering said plate platen onto an exposure bed and vacuum locking said plate to said exposure bed and deactivating the vacuum lock on said platen and raising said platen;

lowering a negative carrier onto said stack of negatives, activating a vacuum lock between said negative carrier and said negative, and raising said negative carrier;

returning said registration carrier to the punching station;

lowering said negative carrier and carried negative onto said plate and activating a vacuum lock therebetween;

exposing said plate; and deactivating said vacuum lock between said negative and said plate and raising said negative carrier.

6. The method defined in claim 5, wherein said plate picking up step includes:

stacking said supply of plates on a plate tray vertically movable between a lower stop and a controlled upper position;

positioning a first end of a plate pickup carriage above said plate tray as an initial position;

moving said plate tray upwardly until plate pickup vacuum cups on said carriage engage a plate on said tray;

activating said plate pickup vacuum cups to hold said plate;

lowering said plate tray to its initial lower stop position;

horizontally moving said plate pickup carriage to a forward stop position; and deactivating said plate pickup vacuum cup to release said plate onto said coating conveyor, said forward position for said pickup carriage positioning a paper pickup vacuum cup carried by an arm on said plate pickup carriage above said plate tray.

7. The method defined in claim 6, wherein said plate picking up step further includes:

moving said plate tray upwardly until said paper pickup vacuum cups engage a separating paper on said stack of plates on said plate tray;

activating said paper pickup vacuum cup to hold said separating paper;

lowering said plate tray to its initial lower limit position;

moving said plate pickup carriage to its initial position; and deactivating said paper pickup vacuum cup to release said separating paper when said plate pickup carriage has returned to its initial position.

8. A method of automatically producing finished lithographic plates from a supply of blank plates and a supply of negatives, comprising the steps of:

picking up a blank plate from said supply of blank plates in a pickup station and placing it on a coating conveyor to a coating station, said coating conveyor including a conveyor stop for preventing a plate from moving on said conveyor when another plate is in the coating station;

coating the underside of said blank plate with a photosensitive fluid in said coating station and then inverting said plate and placing it on a first stage drying conveyor to a drying station, said drying conveyor including a stop for preventing movement of said plate on said drying conveyor when another plate is in said drying station;

drying said fluid on said plate in a two stage drying station by passing said plate through a heated air baffle in a first direction on said first stage drying conveyor on a first level and then moving said plate to a second lower level and placing it on a second stage drying conveyor moving in a second direction opposite to said first direction through said heated air baffle and thereafter conveying said plate to a punching station, said second stage drying conveyor including a stop for preventing movement of said plate when another plate is in said punching station;

punching at least one indexing hole along the edges of said plate in said punching station by positioning said plate for registration with at least one negative carried by a registration carriage and vacuum locking said plate to said registration carriage, punching said indexing hole and then transporting said registration carriage to an exposing station;

exposing said plate to said negative in an exposing station by transferring said plate to a vacuum locked exposure bed, transferring said negative to a vacuum locked negative carrier, transporting said registration carriage back to said punching station, vacuum locking said plate with said negative, exposing said plate, disengaging said negative from said exposed plate and placing said plate on a developing conveyor to a developing station, said developing conveyor including a stop for preventing movement of said plate when another plate is in said developing station;

developing said exposed plate said a developing station and placing said developed plate on a crimping conveyor to a crimping station, said crimping conveyor including a stop for preventing movement of said plate when another plate is in said crimping station; and crimping said edges of said plate having said indexing holes in said crimping station by positioning said plate on a crimping bed, vacuum locking said plate on said crimping bed, crimping said edges of said plate, releasing said vacuum lock on said plate and conveying said finished plate to an exit station.

9. The method defined in claim 8 wherein said plate pickup step includes:

stacking said supply of plates on a plate tray vertically movable between a lower stop and a controlled upper position;

positioning a first end of a plate pickup carriage above said plate tray;

moving said plate tray upwardly until plate pickup vacuum cups on said carriage engage a plate on said tray;

activating said plate pickup vacuum cups to hold said plate;

lowering said plate tray to its initial lower limit position;

horizontally moving said plate pickup carriage to a forward stop position and deactivating said plate pickup vacuum cup to release said plate onto said coating conveyor, said forward position for said pickup carriage positioning a paper pickup vacuum cup above said plate tray;

moving said plate tray upwardly until said paper pickup vacuum cup engages a paper separator on top of said stack and activating said paper pickup vacuum cup to hold said paper separator; and lowering said plate tray to the lower limit position returning said pickup carriage to its initial position and deactivating said paper pickup vacuum cup to release said paper separator.

10. The method defined in claim 9 wherein said punching and exposing steps include:

stacking said supply of negatives on top of said registration carrier, the positional correspondence of said negatives corresponding to a registered position provided by positioning pins which engage said plate on a punching bed;

lowering a plate platen onto said plate and vacuum locking said plate and said platen during the punching step;

raising said platen adn carried negative and transporting said registration carriage to said exposing station;

said exposing step includes moving said registration carriage into said exposure station until a limit stop is reached;

lowering said plate platen onto an exposure bed and vacuum locking said plate to said exposure bed and deactivating the vacuum lock on said platen and raising said platen;

lowering a negative carrier onto said stack of negatives, activating a vacuum lock between said negative carrier and said negative, and raising said negative carrier;

returning said registration carrier to the punching station;

lowering said negative carrier and carried negative onto said plate and activating a vacuum lock therebetween;

exposing said plate; and deactivating said vacuum lock between said negative and said plate and raising said negative carrier.

11. Apparatus for automatically producing finished lithographic plates from a supply of blank plates and a supply of negatives, said apparatus comprising:

means for picking up a blank plate from said supply of blank plates in a pickup station and placing said plate on a coating conveyor to a coating station;

means for coating the underside of said blank plate with a photosensitive fluid in a coating station and the inverting said plate and placing it on a first stage drying conveyor;

means for drying said fluid on said plate in a two stage drying station by passing said plate through a heated air baffle in a first direction on said first stage drying conveyor on a first level and then moving said plate to a second lower level and placing it on a second stage drying conveyor moving in a second direction opposite to said first direction through said heated air baffle and thereafter conveying said plate to a punching station;

means for punching at least one indexing hole along the edges of said plate in a punching station by, first, positioning said plate for registration with at least one negative carried by a registration carrier and vacuum locking said plate to said registration carrier, punching said indexing hole and then transporting said registration carrier to an exposing station;

means for exposing said plate to said negative in an exposing station by transferring said plate to a vacuum locked exposure bed, transferring said negative to a vacuum locked negative carrier, transporting said registration carrier back to said punching station, vacuum locking said plate with said negative, exposing said plate, disengaging said negative from said exposed plate and placing said plate on a developing conveyor to a developing station;

means for developing said exposed plate in a developing station and placing said developed plate on a crimping conveyor to a crimping station; and means for crimping said edges of said plate having said indexing holes in a crimping station by positioning said plate on a crimping bed, vacuum locking said plate on said crimping bed, crimping said edges of said plate, releasing said vacuum lock on said plate and conveying said finished plate to an exit station.

12. The apparatus defined in claim 11, wherein said means for picking up said plate includes:

a plate tray for receiving said stack of blank plates;

a horizontally movable plate pickup carriage having a plurality of plate pickup vacuum cups; and a plate tray for receiving a plurality of blank plates, said plate tray being vertically movable between a lower stop and a controlled stop position wherein said plate pickup vacuum cups engage and hold a plate on said tray, said plate tray thereafter moving to its lower stop position and said plate pickup carriage moving to a forward stop position where said plate pickup vacuum cups release said plate onto said coating conveyor.

13. The apparatus defined in claim 12, wherein said plate picking up means includes:

a paper pickup vacuum cup mounted on an arm extending from said plate pickup carriage and positioned above said plate tray when said pickup carriage is in said forward stop position, said plate tray being movable upwardly until a separating paper on said plate tray engages and is held by said paper pickup vacuum cup and is then returned to its lower stop position whereby said separating paper is pickup up and removed from said plate tray when said plate pickup carriage is returned to its initial position, said paper pickup vacuum cup then releasing said separating paper.

14. The apparatus defined in claim 11, wherein said means for punching and exposing include:

means for stacking said supply of negatives on top of said registration carrier with the positional correspondence of said negatives corresponding to a registered position provided by positioning pins which engage said plate on a punching bed;

a plate platen mounted on said registration carrier beneath said stack of negatives and movable downwardly into contact with said plate having a vacuum lock for locking said plate to said platen during punching and movable upwardly to raise said plate to a transport position;

means for transporting said registration carrier into said means for exposing said plate, said platen and plate then being moved downwardly onto said exposure bed in which said exposure bed vacuum locks said plate and said platen releases its vacuum lock; and means for lowering said negative carrier onto said stack of negatives on said registration carrier and vacuum locking a negative to said carrier and raising said negative carrier, said means for transporting thereafter returning said registration carrier to said means for punching, said means for lowering said negative carrier thereafter lowering said carried negative onto said plate and activating a vacuum lock therebetween and exposing said plate, said vacuum lock between said negative and said plate being thereafter deactivated and said negative carrier returned to its upper position.

15. The apparatus defined in claim 14, wherein said pickup means includes:
a plate tray for receiving said stack of blank plates;
a horizontally movable plate pickup carriage having a plurality of plate pickup vacuum cups; and
a plate tray for receiving a pluraliy of blank plates, said plate tray being vertically movable between a lower stop and a controlled stop position wherein said plate pickup vacuum cups engage and hold a plate on said tray, said plate thereafter moving to its lower stop position and said plate pickup carriage moving to a forward stop position where said plate pickup vacuum cups release said plate onto said coating conveyor.

16. The apparatus defined in claim 15, wherein said picking up means includes:
a paper pickup vacuum cup mounted on an arm extending from said plate pickup carriage and positioned above said plate tray when said pickup carriage is in said forward stop position, said plate tray being movable upwardly until a separating paper on said plate tray engages and is held by said paper pickup vacuum cup and is then returned to its lower stop position whereby said separating paper is picked up and removed from said plate tray when said plate pickup carriage is returned to its initial position, said paper pickup vacuum cup then releasing said separating paper.

17. The apparatus defined in claim 11, wherein said means for picking up, coating, drying, developing and crimping all include:
stops on their associated conveyors for preventing movement of a carried plate when another plate is in a forward means.

18. The method defind in claim 1, wherein:
said exposing step includes disengaging said negative by providing a pivotal arm having a negative pickup vacuum cup on the end thereof which engages said negative and removes it from said exposing station and transfers said negative to a negative collection tray.

19. The apparatus defined in claim 11, wherein said means for exposing includes:
a pivotal arm for disengaging said negative from said negative carrier, said arm having a vacuum cup on the free arm thereof for engaging said negative and removing it from said exposing station and depositing said negative in a collection tray.

* * * * *